(12) United States Patent
Ionascu et al.

(10) Patent No.: US 12,732,185 B2
(45) Date of Patent: Sep. 8, 2026

(54) SMART ELECTRONIC SWITCH

(71) Applicant: Infineon Technologies AG, Neubiberg (DE)

(72) Inventors: Cristian Ionascu, Villach (AT); Christian Djelassi-Tscheck, Villach (AT); Ioan-Alexandru Tranca, Villach (AT); Klaus Hoermaier, Krumpendorf (AT)

(73) Assignee: Infineon Technologies AG, Neubiberg (DE)

( * ) Notice: Subject to any disclaimer, the term of this patent is extended or adjusted under 35 U.S.C. 154(b) by 8 days.

(21) Appl. No.: 19/052,116

(22) Filed: Feb. 12, 2025

(65) Prior Publication Data

US 2025/0300654 A1 Sep. 25, 2025

(30) Foreign Application Priority Data

Mar. 20, 2024 (DE) ........................ 102024108027.2

(51) Int. Cl.
*H03K 17/687* (2006.01)
*G06F 13/42* (2006.01)

(52) U.S. Cl.
CPC ....... *H03K 17/687* (2013.01); *G06F 13/4282* (2013.01); *G06F 2213/0002* (2013.01); *H03K 2217/0081* (2013.01)

(58) Field of Classification Search
CPC ........ G06F 13/4282; G06F 2213/0002; H03K 17/687; H03K 2217/0081
USPC ................................................. 327/108, 109
See application file for complete search history.

(56) References Cited

U.S. PATENT DOCUMENTS

| | | | |
|---|---|---|---|
| 6,438,462 | B1 | 8/2002 | Hanf et al. |
| 9,413,352 | B2 | 8/2016 | Lim |
| 9,843,319 | B2 | 12/2017 | Petruzzi et al. |
| 9,887,532 | B2 | 2/2018 | Djelassi et al. |
| 9,954,548 | B2 | 4/2018 | Illing et al. |
| 10,170,905 | B2 | 1/2019 | Illing et al. |
| 10,868,418 | B2 | 12/2020 | Djelassi-Tscheck et al. |

(Continued)

FOREIGN PATENT DOCUMENTS

| | | | |
|---|---|---|---|
| DE | 19611942 | A1 | 10/1997 |
| DE | 102012212890 | A1 | 1/2013 |

(Continued)

OTHER PUBLICATIONS

Office Action, in the German language, from counterpart German Application No. 102024108027.2, dated Jan. 15, 2025, 4 pp.

*Primary Examiner* — William Hernandez
(74) *Attorney, Agent, or Firm* — Shumaker & Sieffert, P.A.

(57) ABSTRACT

Accordingly, a smart switch device is described herein. In one embodiment, the device includes a first supply circuit configured to provide, based on a first supply voltage, an first voltage at a first output node; a second supply circuit configured to provide, based on a second supply voltage, a second voltage at a second output node; and a power management unit configured to provide a third voltage at a third output node based on both, the first supply voltage and the second supply voltage. The first, the second, and the third output nodes are coupled to a buffer capacitor. The device further includes a wakeup circuit configured to detect a wakeup event and further configured to enable the power management unit upon detecting a wakeup event.

11 Claims, 2 Drawing Sheets

(56) References Cited

U.S. PATENT DOCUMENTS

| | | | |
|---|---|---|---|
| 11,018,664 | B2 | 5/2021 | Bernardoni et al. |
| 11,177,644 | B2 | 11/2021 | Mayer et al. |
| 11,271,558 | B2 | 3/2022 | Djelassi-Tscheck et al. |
| 11,349,471 | B2 | 5/2022 | Mayer et al. |
| 11,404,866 | B2 | 8/2022 | Illing et al. |
| 11,405,032 | B2 | 8/2022 | Bernardoni et al. |
| 11,431,162 | B2 | 8/2022 | Djelassi-Tscheck et al. |
| 11,527,881 | B2 * | 12/2022 | Bernardoni ...... G01R 19/16571 |
| 11,539,357 | B2 | 12/2022 | Mayer et al. |
| 12,341,332 | B2 * | 6/2025 | Djelassi-Tscheck ..... H02H 3/18 |
| 2005/0063504 | A1 * | 3/2005 | Ilg ........................... H02J 13/12<br>375/373 |
| 2013/0027114 | A1 | 1/2013 | Petruzzi et al. |
| 2017/0040901 | A1 * | 2/2017 | Tumminaro ...... H02M 3/33523 |
| 2017/0063077 | A1 | 3/2017 | Donath et al. |
| 2017/0294772 | A1 | 10/2017 | Illing et al. |
| 2017/0294774 | A1 * | 10/2017 | Illing ...................... H03M 1/12 |
| 2017/0294918 | A1 | 10/2017 | Illing et al. |
| 2017/0294922 | A1 | 10/2017 | Illing et al. |
| 2017/0332328 | A1 * | 11/2017 | Cheng .................. H04W 92/02 |
| 2018/0287365 | A1 | 10/2018 | Djelassi-Tscheck et al. |
| 2019/0052074 | A1 | 2/2019 | Asam et al. |
| 2019/0190255 | A1 * | 6/2019 | Illing ..................... H02H 3/087 |
| 2020/0042028 | A1 | 2/2020 | Deval |
| 2021/0028615 | A1 | 1/2021 | Mayer et al. |
| 2021/0028780 | A1 | 1/2021 | Mayer et al. |
| 2021/0028781 | A1 | 1/2021 | Mayer et al. |
| 2021/0050718 | A1 | 2/2021 | Djelassi-Tscheck et al. |
| 2021/0050848 | A1 | 2/2021 | Bernardoni et al. |
| 2021/0050850 | A1 | 2/2021 | Djelassi-tscheck et al. |
| 2021/0083659 | A1 | 3/2021 | Mayer et al. |
| 2023/0411947 | A1 | 12/2023 | Djelassi-Tscheck et al. |

FOREIGN PATENT DOCUMENTS

| | | | |
|---|---|---|---|
| DE | 102016100498 | A1 | 7/2016 |
| DE | 102016103167 | A1 | 8/2016 |
| DE | 102015114460 | A1 | 3/2017 |
| DE | 102017107521 | A1 | 10/2017 |
| DE | 102017107520 | A1 | 11/2017 |
| DE | 102017107523 | A1 | 11/2017 |
| DE | 102017106896 | A1 | 10/2018 |
| DE | 102020100601 | A1 | 7/2020 |
| DE | 112019003896 | T5 | 4/2021 |
| DE | 102020105094 | A1 | 9/2021 |
| DE | 102022115099 | A1 | 12/2023 |

* cited by examiner

SMART ELECTRONIC SWITCH

This Application claims priority to German Application Number 102024108027.2 filed on Mar. 20, 2024, the entire content of which is incorporated herein by reference.

TECHNICAL FIELD

The present disclosure relates to the field of smart semiconductor switches.

BACKGROUND

Intelligent electronic switches, also referred to as smart switches, usually include a transistor that is used for switching an electronic load as well as supplemental circuitry such as gate drivers, over-current or over-temperature circuits, current sensing circuits, digital communication interfaces or the like. Particularly for the use in battery driven applications, smart switches may operate in a so-called idle mode, in which the smart switch's own power consumption is reduced even when the switch is on. Moreover, robustness against transient disturbances is a design goal. For the purpose of testing integrated circuit these transient disturbances, which may occur on the supply lines, have been defined in different standards such as, for example, ISO7637-2, ISO 16750-2 or SAE J1113-11. Another example for transient disturbances are so-called micro-cuts, which are short-term (i.e. in the range of a few (up to 100) microseconds) interruptions of the voltage supply.

The inventors have set themselves the objective to improve existing smart switch concepts to increase the robustness of their operation.

SUMMARY

The object mentioned above is achieved by the device of claim 1. Various embodiments and further developments are covered by the dependent claims. Accordingly, a circuit for use as an electronic fuse is described herein.

Accordingly, a smart switch device is described herein. In one embodiment, the device includes a first supply circuit configured to provide, based on a first supply voltage, an first voltage at a first output node; a second supply circuit configured to provide, based on a second supply voltage, a second voltage at a second output node; and a power management unit configured to provide a third voltage at a third output node based on both, the first supply voltage and the second supply voltage. The first, the second, and the third output nodes are coupled to a buffer capacitor. The device further includes a wakeup circuit configured to detect a wakeup event and further configured to enable the power management unit upon detecting a wakeup event.

In one embodiment, the first, the second, and the third output nodes are coupled to the buffer capacitor via respective diodes. The buffer capacitor may be connected between an internal ground node and an internal supply node at which an internal supply voltage is provided. In one embodiment, the wakeup circuit is supplied by internal supply voltage.

In one embodiment, the device may include a mode control circuit that is configured to disable the power management unit upon transition into an idle mode. The mode control circuit may be configured to initiate a transition from idle mode into normal mode in response to the wakeup circuit detecting a wakeup event. One possible wakeup event may be a transient voltage swing in the first supply voltage.

BRIEF DESCRIPTION OF THE DRAWINGS

The invention can be better understood with reference to the following drawings and descriptions. The components in the figures are not necessarily to scale; instead emphasis is placed upon illustrating the principles of the invention. Moreover, in the figures, like reference numerals designate corresponding parts. In the drawings:

FIG. 2 illustrates the use of the device of FIG. 1 in an electronic control unit (ECU) or the like.

DETAILED DESCRIPTION

In the following detailed description, reference is made to the accompanying drawings. The drawings form a part of the description and, for the purpose of illustration, show examples of how the embodiments may be used and implemented. It is to be understood that the features of the various embodiments described herein may be combined with each other, unless specifically noted otherwise.

Figure 1:
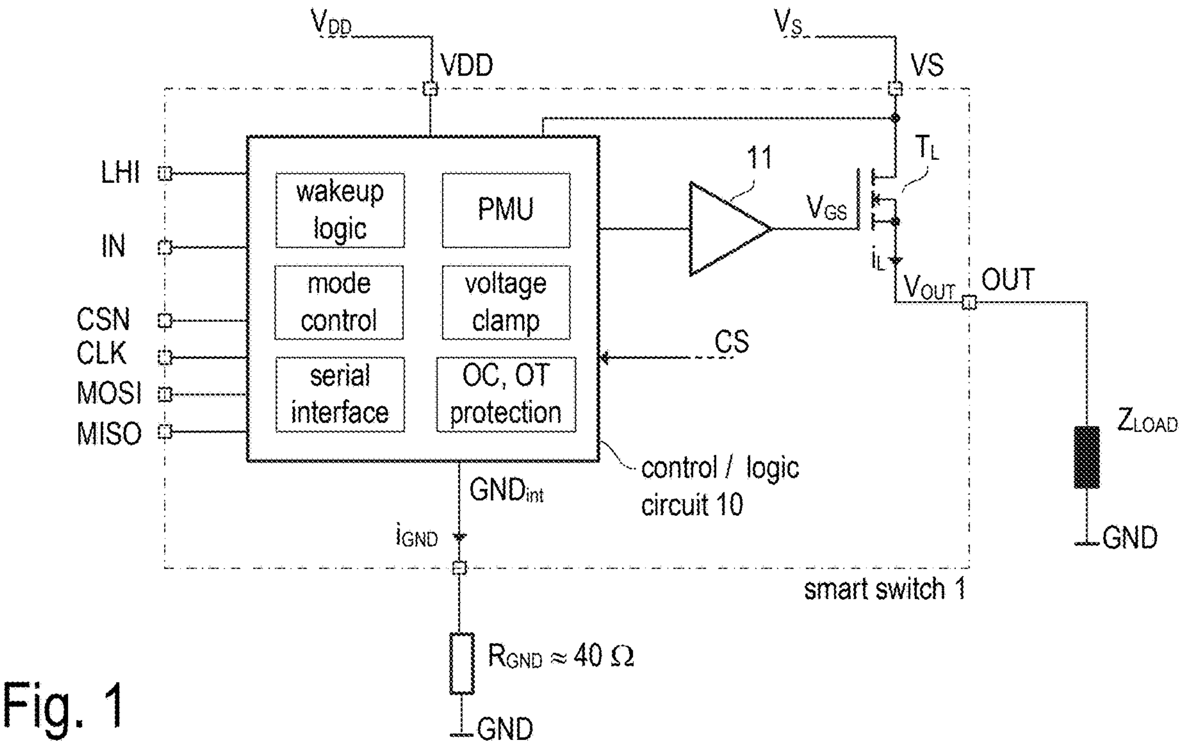
FIG. 1 illustrates a simple example of a smart switch device.

FIG. 1 illustrates a simple example of a smart switch device 1. In the depicted example, the smart switch 1 includes a transistor $T_L$ that is coupled between a first supply node VS and an output node OUT. The transistor may be a metal-oxide-semiconductor (MOS) field-effect transistor (MOSFET), an insulated gate bipolar transistor (IGBT) or any other type of electronic switch. The first supply node VS and the output node OUT may be connected to chip contacts (e.g. pins or solder balls), and the first supply node VS receives, during operation, the first supply voltage VS (e.g. battery voltage of 13.8V). The smart switch 1 also includes a control circuit 10 which is configured to generate a logic signal $S_{ON}$ which is provided, as input signal, to a gate driver circuit 11. The gate driver circuit 11 applies a gate-source voltage $V_{GS}$ to the gate electrode of the transistor $T_L$ in accordance with the logic signal $S_{ON}$. For this purpose, the gate driver circuit 11 may include one or more current sources that generate a gate current $i_G$ for charging/discharging the gate of the transistor $T_L$. Various suitable gate driver implementations are as such known and thus not further described herein.

In the depicted embodiment, the smart switch has a second supply node VDD, which, during operation, receives a second supply voltage $V_{DD}$ for the control circuit 10. The second supply voltage $V_{DD}$ may be a stabilized voltage of approximately 3.3V or 5V. The control circuit 10 receives both supply voltages, $V_S$ and $V_{DD}$. Furthermore, the control circuit 10 is coupled to an internal ground node $GND_{int}$. Like the first supply node VS, the second supply node VDD and the internal ground node $GND_{int}$ may be connected to respective chip contacts. In the depicted example, the internal ground node $GND_{int}$ is connected to ground potential via a resistor $R_{GND}$. In the depicted example, the resistor $R_{GND}$ has 40 ohms. However, different resistance values may be used dependent on the actual implementation.

The control circuit may be connected to various input and output terminals of the smart switch in order to be able to communicate with other circuitry. In the example of FIG. 1, the control circuit 11 includes a serial communication interface, which may be, for example, a Serial Peripheral Interface (SPI). In case of an SPI, the terminals MOSI and MISO are used for uplink and downlink communication, the terminal CLK is used to receive a clock signal, and the terminal CSN is used to receive an enable signal (chip select signal). SPI and various other types of serial communication interfaces are as such known and thus not further discussed herein. The terminal IN is used to receive an input signal $S_{IN}$ that indicates, to the control circuit 10, whether to switch the transistor $T_L$, on or off. The terminal LHI is used to receive a logic signal indicating the "limp home" mode.

In the depicted example, the control circuit 10 receives a current sense signal CS which is indicative of the load current in that is output to the load $Z_{LOAD}$ connected to the output node OUT. Various current sense circuits are as such known and thus not further discussed herein. In a very simple embodiment, a current sense resistor may be connected between the transistor $T_L$ and the electric load $Z_{LOAD}$ to convert the load current in, into a voltage signal that may be used for current sensing.

The control circuit 10 may include a several circuits implementing different functions such as, for example, the mentioned serial communication interface, over-current (OC) and over-temperature (OT) protection, a power management unit (PMU), a mode control logic and a wakeup logic. The mode control logic is configured to initiate mode changes (e.g. idle mode, normal mode) and to configure other components of the control circuit dependent on the current mode. The wakeup logic indicates, to the mode control logic, the detection of a wakeup event so that the mode control logic is able to initiate a mode change from idle mode to, e.g., normal mode.

Figure 2:
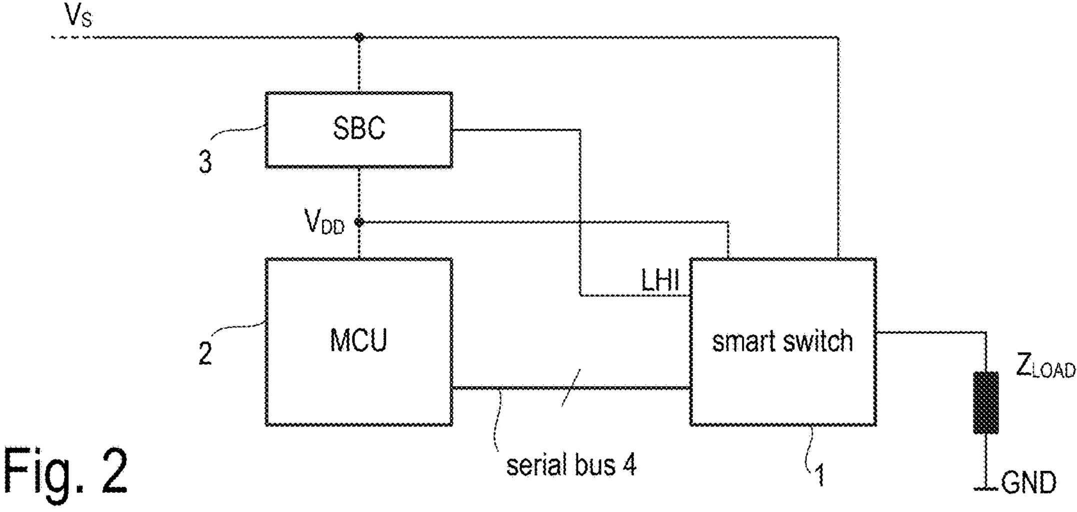

FIG. 2 illustrates how the smart switch 1 of FIG. 1 may be used, for example, in an electronic control unit (ECU) or the like. In the present example, the ECU includes a system basis chip 3 (SBC), a controller circuit 2 (MCU) such as, for example, a microcontroller, and the smart switch 1. SBCs are commonly used in automotive ECUs to provide various basic functions. Accordingly, the SBC may include, for example, one or more of the following components: voltage regulators, supervision functions, reset generators, watchdog functions, bus interfaces, etc. In the present example, the SBC 3 includes a voltage regulator configured to provide the second supply voltage $V_{DD}$ from the first supply voltage $V_S$ as well as the signal LHI indicating Limp Home mode. The microcontroller 2 as well as the smart switch 1 are supplied by the second supply circuit $V_{DD}$. Furthermore, as discussed above, a serial bus 4 may be used for communication between microcontroller 2 and smart switch 1. It is noted that the smart switch does not necessarily have to have all the terminals shown in FIG. 1. For example, the input terminal IN may be not needed if switch on/off commands are transmitted via the serial bus 4.

Figure 3:
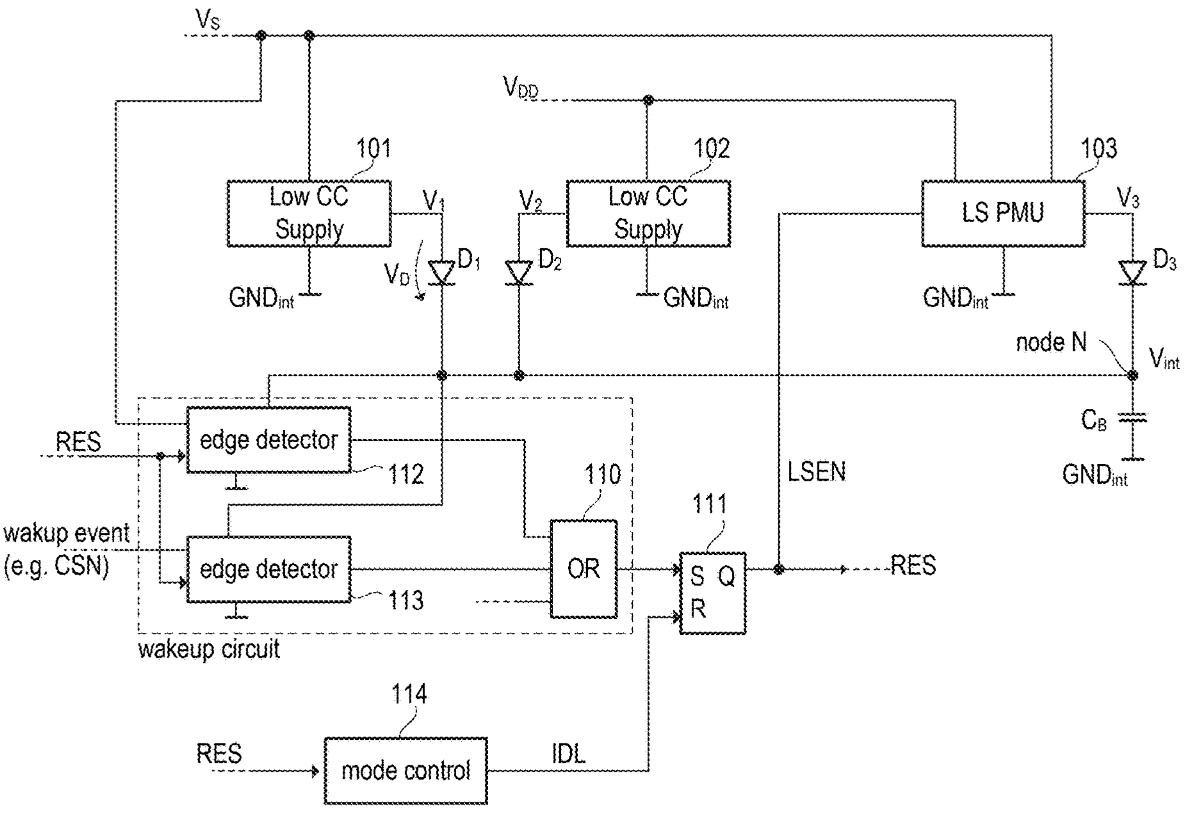
FIG. 3 illustrates a portion of the control circuit of a smart switch in accordance with one embodiment.

FIG. 3 illustrates a portion of the control circuit 10 of a smart switch in accordance with one embodiment. The circuit of FIG. 3 particularly relates to an embodiment of an internal supply circuit which provides an internal supply voltage $V_{int}$ that can be used by a wakeup circuit during idle mode.

The internal supply circuit includes a first supply circuit 101 that is configured to provide a first voltage $V_1$ at a first output node based on a first supply voltage $V_S$ and a second supply circuit 102 configured to provide a second voltage $V_2$ at a second output node based on a second supply voltage $V_{DD}$. The internal supply circuit further includes a power management unit 103 that is configured to provide a third voltage $V_3$ at a third output node based on both, the first supply voltage $V_S$ and the second supply voltage $V_{DD}$. The first, the second, and the third output nodes are coupled (at circuit node N) to a buffer capacitor $C_B$, which, during operation, is charged up to the internal supply voltage $V_{int}$. That is, the internal supply voltage $V_{int}$ is the voltage drop across the capacitor $C_B$. A wakeup circuit is supplied by the internal supply voltage, configured to detect a wakeup event, and further configured to enable the power management unit 101 upon detecting a wakeup event.

In the depicted example, the first output node (of supply circuit 101) is connected to the buffer capacitor $C_B$ via a diode $D_1$, the second output node (of supply circuit 102) is connected to the buffer capacitor $C_B$ via a diode $D_2$, and the third output node (of power management unit 103) is connected to the buffer capacitor $C_B$ via a diode $D_3$. The first supply circuit 101 is configured to compensate to the voltage drop (forward voltage) across the diode $D_1$. That is, the first voltage $V_1$, which is provided by the first supply circuit 101, is generated such that the difference $V_1$-$V_D$ equals the desired internal supply voltage $V_{int}$. Similarly, the second voltage $V_2$, which is provided by the second supply circuit 102, is generated such that the difference $V_2$-$V_D$ equals the desired internal supply voltage $V_{int}$. finally, the third voltage $V_3$, which is provided by the power management unit 103, is generated such that the difference $V_3$-$V_D$ equals the desired internal supply voltage $V_{int}$. In this example, it is assumed that the forward voltage $V_D$ is the same for the diodes $D_1$, $D_2$ and $D_3$, which is not necessarily the case in other embodiments. As can be seen from FIG. 2, the first and second supply circuits 101 and 102 and the power management unit 103 (when activated) redundantly charge the buffer capacitor $C_B$ and thus redundantly provide and maintain the internal supply voltage $V_{int}$ via diode $D_3$.

Using diodes $D_1$-$D_3$ to connect the first supply circuit 101, the second supply circuit 102 and the power management unit 103 with the circuit node N can be regarded as a kind of or-conjunction. Accordingly, the buffer capacitor $C_B$ can maintain the internal supply voltage $V_{int}$ if at least one of the circuits 101, 102, or 103 is active.

Both, the first supply circuit 101 and the second supply circuit 102 are designed to sink only a very low quiescent current (e.g. in the range of a few 100 nanoamperes). This feature comes with the drawback that the circuits 101 and 102 are not able to compensate for or suppress transient disturbances. In contrast thereto, the power management unit 103 is designed to be capable of compensating for fast transient disturbances occurring at the supply lines. This feature comes at the cost of a higher quiescent current.

The low quiescent current of the first and second supply circuits 101 and 102 are desirable because the supply circuits 101 and 102 are kept active even in idle mode or sleep mode, in which the power management unit 103 is inactive to reduce the smarts switch's own current consumption $i_{GND}$. The concept of ide/sleep mode operation in smart switches to reduce the smart switch's own current consumption is as such known and this not explained here in more detail. Dependent on the implementation, various different criteria may be used to enter the idle mode. In many applications, one criterion is the load current in provided at the output node OUT being below a defined threshold $i_{IDLE}$. Similarly, different criteria may be used to leave the idle mode and to resume normal operation. The latter criteria are herein referred to as wakeup events.

As already mentioned, the transition from normal mode to idle mode and vice versa is controlled by a mode control circuit 114 which may be regarded as part of the control circuit 10 (cf. FIG. 1). In the example of FIG. 3, the mode control circuit 114 generates a logic signal IDL that indicates a transition into idle mode. During the transition into idle mode many portions of the smart switch are deactivated to reduce the smart switch's own current consumption. As mentioned, the concept of idle mode operation is as such known and therefore, the transition into idle mode is only discussed here to an extent relevant for the embodiments described herein. According to the example of FIG. 6 the logic signal IDL provided by the mode control circuit 114 resets an SR-latch 111. The output of which is used as enable signal LSEN for the power management unit 103. When the latch 111 is reset, the enable signal LSEN is set to a low level to deactivate the power management unit 103 during idle mode.

To leave the idle mode and trigger a transition into the normal mode, the latch 111 is set in response to the mentioned wakeup circuit detecting a wakeup event. For this purpose the wakeup circuit may include several detectors 112, 113 configured to detect different wakeup events. The detectors 112, 113 may indicate the detection of a wakeup event by generating a logic signal with a High level as output signal. In this example, the output signals of the detectors 112 and 113 may be combined using the or-gate 110, the output of which indicates that one of the detectors has detected a wakeup event. Thus, the output of the or-gate 110 is connected to the set input of the latch 111. The latch 111 may be regarded as part of the mode control circuit 114 but is shown as a separate component in FIG. 3 to make the function of the overall circuit more clear. The detectors 112, 113 and the or-gate may be regarded as part of the wakeup circuit. Dependent on the implementation the detector may need to be reset before being able to detect another occurrence of the wakeup event. This is why the output signal RES of the latch 111 is supplied to the detectors 112 and 113. Accordingly, in the present example, the detectors 112 and 113 are reset upon transition into idle mode (when the latch 111 is reset and the latch's output signal RES assumes a Low level).

The redundant supply circuits 101 and 102 are provided to increase robustness against transient disturbances. As explained in the introductory part, transient disturbances, which may occur on the supply lines, have been defined in different standards. Transient signal waveforms as defined e.g. in ISO7637-2 ISO 16750-2 are referred to as ISO pulses. The occurrence of an ISO pulse on the supply line may cause a short term interruption of the voltage supply. For example, a negative ISO pulse may cause an interruption of the main supply voltage $V_S$ (e.g. for 2-200 ms). A negative ISO pulse may lead to a shift of the electric potential $V_{GND}$ of the internal ground $GND_{int}$ (ground shift) caused by a transient voltage drop occurring across the resistor $R_{GND}$. This ground shift results in a short term loss of the second supply voltage $V_{DD}$ (because $V_{DD}$-$V_{GND}$ drops as $V_{GND}$ rises significantly above zero). So called micro-cuts have a similar effect as negative ISO pulses (interruption of supply voltage $V_S$) but usually micro-cuts only last for approximately 100 μs.

As both supply voltages, $V_S$ and $V_{DD}$ may be interrupted due to ISO pulses or similar transients, the redundant low quiescent current supply circuits 101 and 102 help to increase robustness of the smart switch during idle mode operation, when the power management unit 103 is inactive. To avoid the reset of the whole device (and to avoid the need for the microcontroller to restart the smart switch) the wakeup circuit is configured to detect—as one wakeup event—a transient voltage swing in the first supply voltage $V_S$. In the example of FIG. 3, the detector 112 receives the voltage $V_S$ as input signal and signals at its output the detection of a transient voltage swing. Also a rising edge of a micro-cut may be detected as wakeup event. Moreover, another wakeup event may be an activity on the bus lines. For example, the detector 113 may be configured to detect a chip select signal (see FIG. 1, CSN) which indicates an incoming communication across the serial bus.

The fact that a transient disturbance on the supply line providing the supply voltage $V_S$ can be detected as wakeup event and thus trigger a transition into normal mode and an activation of the power management unit 103 may further increase robustness and avoid the undesired reset of the device. As mentioned, the power management unit 103 is capable of compensating for fast transients on the supply lines and provides a stable internal supply voltage $V_{int}$.

The invention claimed is:

1. A smart switch comprising:

a first supply circuit configured to provide a first voltage at a first output node based on a first supply voltage;

a second supply circuit configured to provide a second voltage at a second output node based on a second supply voltage;

a power management unit configured to provide a third voltage at a third output node based on both the first supply voltage and the second supply voltage, wherein the first output node, the second output node, and the third output nodes are coupled to a buffer capacitor; and a wakeup circuit configured to detect a wakeup event and further configured to enable the power management unit upon detecting a wakeup event.

2. The smart switch of claim 1, wherein the first output node, the second output node, and the third output nodes are coupled to the buffer capacitor via respective diodes.

3. The smart switch of claim 2, wherein the first supply circuit and the second supply circuit are configured to compensate for a forward voltage of a diode.

4. The smart switch of claim 1, wherein the buffer capacitor is connected between an internal ground node and an internal supply node at which an internal supply voltage is provided.

5. The smart switch of claim 1, wherein the wakeup circuit is supplied by an internal supply voltage.

6. The smart switch of claim 1, further comprising:

a mode control circuit configured to disable the power management unit upon transition into an idle mode.

7. The smart switch of claim 6, wherein the mode control circuit is configured to initiate a transition from the idle mode into a normal mode in response to the wakeup circuit detecting the wakeup event.

8. The smart switch of claim 1, wherein the wakeup event comprises a transient voltage swing in the first supply voltage.

9. The smart switch of claim 1, wherein the wakeup event comprises an incoming communication from a serial bus, and wherein the incoming communication comprises a select signal received from the serial bus.

10. The smart switch of claim 1, wherein the wakeup circuit includes a first edge detection circuit configured to detect—as the wakeup event—a first transient voltage swing in the first supply voltage.

11. The smart switch of any of claim 1, wherein the power management unit is configured to compensate for fast transients occurring on supply lines.

* * * * *